(12) United States Patent
Ohkubo et al.

(10) Patent No.: US 6,707,072 B2
(45) Date of Patent: Mar. 16, 2004

(54) SEMICONDUCTOR LASER MODULE

(75) Inventors: Michio Ohkubo, Tokyo (JP); Yutaka Ohki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/028,790

(22) Filed: Dec. 28, 2001

(65) Prior Publication Data

US 2002/0117678 A1 Aug. 29, 2002

(30) Foreign Application Priority Data

Feb. 28, 2001 (JP) ........................................ 2001-054194

(51) Int. Cl.[7] .............................................. H01L 33/00
(52) U.S. Cl. ............................ 257/98; 372/19; 372/20; 372/32; 372/49; 372/95; 372/100; 372/102
(58) Field of Search .............................. 372/19, 20, 32, 372/42, 95, 100, 102

(56) References Cited

U.S. PATENT DOCUMENTS

| | | |
|---|---|---|
| 5,271,024 A | 12/1993 | Huber |
| 5,563,732 A | 10/1996 | Erdogan et al. |
| 5,993,073 A | 11/1999 | Hamakawa et al. |
| 6,115,401 A * | 9/2000 | Scobey et al. ............... 372/100 |
| 6,335,944 B1 * | 1/2002 | Mugino et al. ............. 372/102 |

FOREIGN PATENT DOCUMENTS

| | | |
|---|---|---|
| JP | 9-246645 | 9/1997 |
| JP | 9-283847 | 10/1997 |
| JP | 10-293234 | 11/1998 |
| JP | 11-163471 | 6/1999 |
| JP | 2001-257422 | 9/2001 |

* cited by examiner

*Primary Examiner*—David Nelms
*Assistant Examiner*—Mai-Huong Tran
(74) *Attorney, Agent, or Firm*—Oblon, Spivak, McClelland, Maier & Neustadt, P.C.

(57) ABSTRACT

A semiconductor laser module in which an exciting laser beam output is always allowed to be in a multi-mode and the variation of optical output does not occur. In the semiconductor laser module, a semiconductor laser device, light coupling means and an optical fiber are disposed, and further, a light feedback (return) portion where a laser beam of a specific wavelength is reflected is formed, and the reflection spectrum at the light feedback portion has a shape similar to a rectangular one.

14 Claims, 6 Drawing Sheets

REFLECTION BANDWIDTH

SEMICONDUCTOR LASER MODULE

BACKGROUND OF THE INVENTION

1. Field of the Invention

The present invention relates to a semiconductor laser module, and more specifically relates to a semiconductor laser module, which outputs an exciting laser beam of a specific wavelength in a stabilized state.

2. Prior Art

A wavelength division multiplexing (WDM) communication system has been developed as an optical communication system, which transmits signal rays of plurality. In this system, for example an Er doped optical fiber amplifier (EDFA) is placed in a predetermined position of an optical path, and a plurality of laser modules in each of which a semiconductor laser device has been incorporated as a light source are connected to the EDFA, and exciting laser beams from these laser modules are caused to enter said EDFA. Then, the signal rays transmitted from the light source of the signal rays are optically amplified, and the amplified signal rays are transmitted on the downstream side.

A laser module that outputs exciting laser beams has such a structure as shown in FIG. 1. That is, thermo-modules 2 composed of plural Peltier devices are disposed in a package 1. On the thermo-modules 2 are fixedly disposed a substrate 6 to which a laser device 3, a thermistor 4 and a lens 5, which is optical coupling means, is fixed, and in a through hole 1b formed in a side wall 1a of the package 1 is fixedly disposed an optical fiber 7 formed with a fiber grating 7a that functions as an optical feedback portion.

In this laser module, an oscillation laser beam emitted from an emitting end face (front facet) of the laser device 3 is focused on the lens 5 and enters a facet 7b of an optical fiber 7. And among the laser beams that entered the optical fiber 7, only a laser beam of a specific wavelength positioned in the vicinity of the central wavelength of a reflection bandwidth of the fiber grating 7a is fed back (returned) to the laser device 3 so that the wavelength of an oscillation laser beam from the laser device 3 is fixed to the specific wavelength. As a result, an exciting laser beam of the specific wavelength is output from the laser module.

In case of the laser module shown in FIG. 1, when the laser device 3 is heated by driving current supplied to the laser device 3 to increase the temperature of the device 3, the wavelength and light intensity of the oscillation laser beam is varied so that the optical output of the oscillation laser beam from the laser module becomes instable. To prevent such a problem, the temperature of the laser device 3 is measured with the thermistor 4 and an external control circuit (not shown) is activated to control the operating current of the thermo-module 2. As a result, the laser device 3 is cooled and the stability of the wavelength of the oscillation laser beam from the laser device 3 is attained.

However, in a case where the laser device 3 incorporated into a laser module is one, for example, a GaAs-based laser device, which is oscillated in a wavelength region of 980 nm, when a light feedback portion such as the fiber grating 7a is formed, the optical output of the obtained exciting laser beam change greatly with lapse of time to exhibit sometimes an unstable state of optical output.

OBJECT AND SUMMARY OF THE INVENTION

It is an object of the present invention to solve the above-mentioned problems in a laser module in which a laser device, which oscillates in a wavelength region of 980 nm, is incorporated and a light feedback portion such as a fiber grating is formed, and provide a semiconductor laser module, which can realize its stability by suppressing the time-dependent changes for the optical output of an exciting laser beam.

To attain the above-mentioned object, according to the present invention, there is provided a semiconductor laser module comprising: a semiconductor laser device, an optical fiber, light-coupling means, which causes a laser beam emitted from the semiconductor laser device to enter the optical fiber, and a light-feedback portion, which reflects a laser beam of a specific wavelength, wherein a reflection spectrum shape at the light-feedback portion is substantially rectangular.

Further, there is provided a semiconductor laser module comprising: a semiconductor laser device, an optical fiber, light-coupling means, which causes a laser beam emitted from the semiconductor laser device to enter the optical fiber, and a light-feedback portion, which reflects a laser beam of a specific wavelength, wherein a reflection spectrum shape at the light-feedback portion is one in which the top portion has projected and recessed portions.

DETAILED DESCRIPTION OF THE INVENTION

Figure 1:
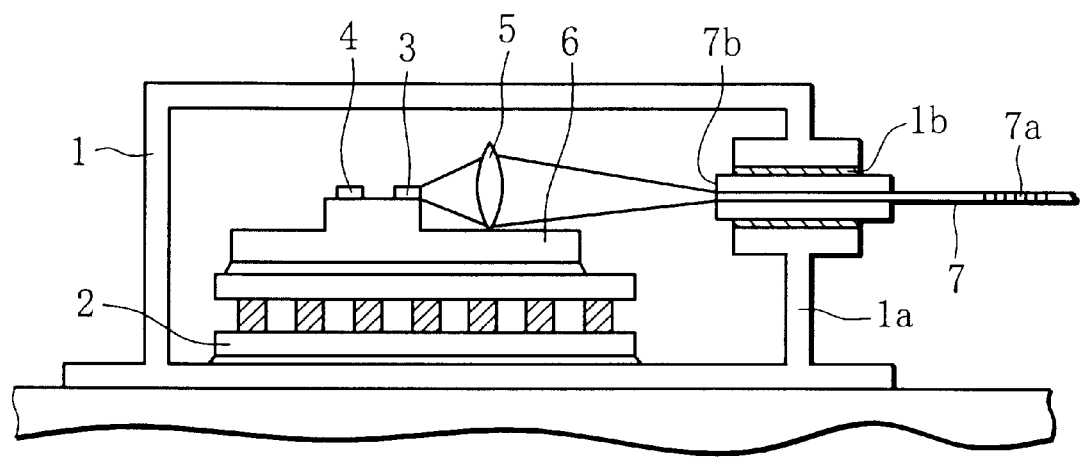
FIG. 1 is a schematic view showing one embodiment of a laser module.

The present inventor observed the spectrums of an exciting laser beam output from a laser module having the configuration shown in FIG. 1, and obtained the following findings:

(1) In case of an exciting laser beam with unstable optical output, an oscillation single mode in which the laser beam oscillates in only one longitudinal mode and oscillation multi-modes in which the laser beam oscillates in a plurality of longitudinal modes alternately appear in the spectral curve.

(2) The output of an exciting laser beam, which is always in oscillation multi-modes with time, is stable.

Based on the above-mentioned findings the present inventor confirmed the necessity of allowing the exciting laser beam to oscillate always in multi-modes to stabilize the optical output of the exciting laser beam. Thus, the present inventor studied the relationships between the properties of the light feedback portion and allowing the exciting laser beam to be in the multi-modes and formed a light feedback portion to be described later. As a result the present inventor has found the facts that the exciting laser beam output from the laser module is always allowed to be in multi-modes and the optical output is stabilized.

Based on such findings, the semiconductor laser module of the present invention has been developed.

Figure 2:
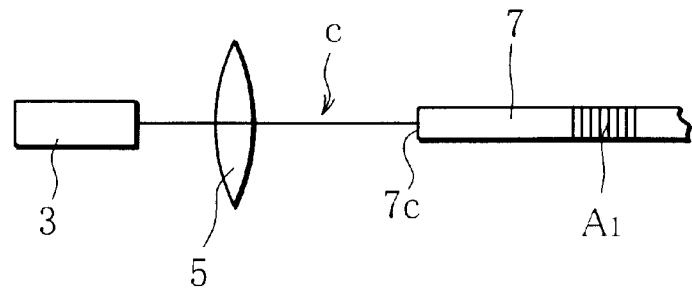
FIG. 2 is a schematic view showing an embodiment of the basic configuration of a laser module according to the present invention.

One embodiment of a principal component of a laser module according to the present invention is shown in FIG. 2 as a schematic view.

In this laser module, a laser device 3, optically coupling means (lens) 5, and an optical fiber 7 are optically coupled in this order with their optical axes C matched with each other and the entire optically coupled system is sealed in a package 1 as shown in FIG. 1. It is noted that as the laser device 3 a device having an oscillation wavelength of 940 to 1100 nm is used.

A chirped grating $A_1$ is formed in the optical fiber 7. The chirped grating $A_1$ functions as a light feedback portion. Further, the entrance facet 7c of the optical fiber 7 is a plane perpendicular to the optical axis.

In this laser module, the oscillation laser beam from the laser device 3 is focused on the lens 5 to enter the facet 7c of the optical fiber 7. Then, among the entered laser beams, only a laser beam of a specific wavelength within the reflection bandwidth of the chirped grating $A_1$ is reflected at the associated chirped grating $A_1$ and is returned back via the lens 5 to the laser device 3 again. By repeating such procedures, the wavelength of the laser beam emitted from the laser device 3 is fixed to a wavelength in the vicinity of the central wavelength of a reflection bandwidth of the chirped grating $A_1$ and the laser beam is output from the optical fiber 7 as an exciting laser beam.

Figure 3:
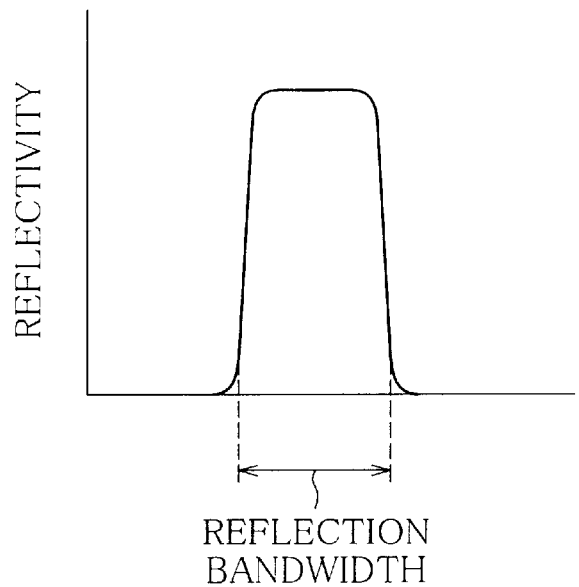
FIG. 3 is a reflection spectrum view of a reflection laser beam in a light-feedback portion of the laser module according to the present invention.

When the reflection spectrum at the chirped grating (light feedback portion) $A_1$ is drawn, the reflection properties become a shape similar to a rectangular shape as shown in FIG. 3.

Therefore, the chirped grating (light feedback portion) $A_1$ can make light having a wide wavelength band return back to the laser device 3. Accordingly, the threshold value of a carrier density required for oscillation of the laser device 3 can be decreased in a wide wavelength band. Thus, a beam from the laser device 3 can be oscillated in a longitudinal mode positioned in a wavelength band where the threshold value of a carrier density of the laser device 3 is decreased. As a result, the oscillation laser beam from the laser device 3 is made to be in multi-modes.

Then, as the laser beam in multi-modes is output as an excitation laser beam from the optical fiber 7, the optical output of the excitation laser beam will be stabilized.

The reflection spectrum, which realizes the above-mentioned reflection properties will be described as follows.

Figure 4:
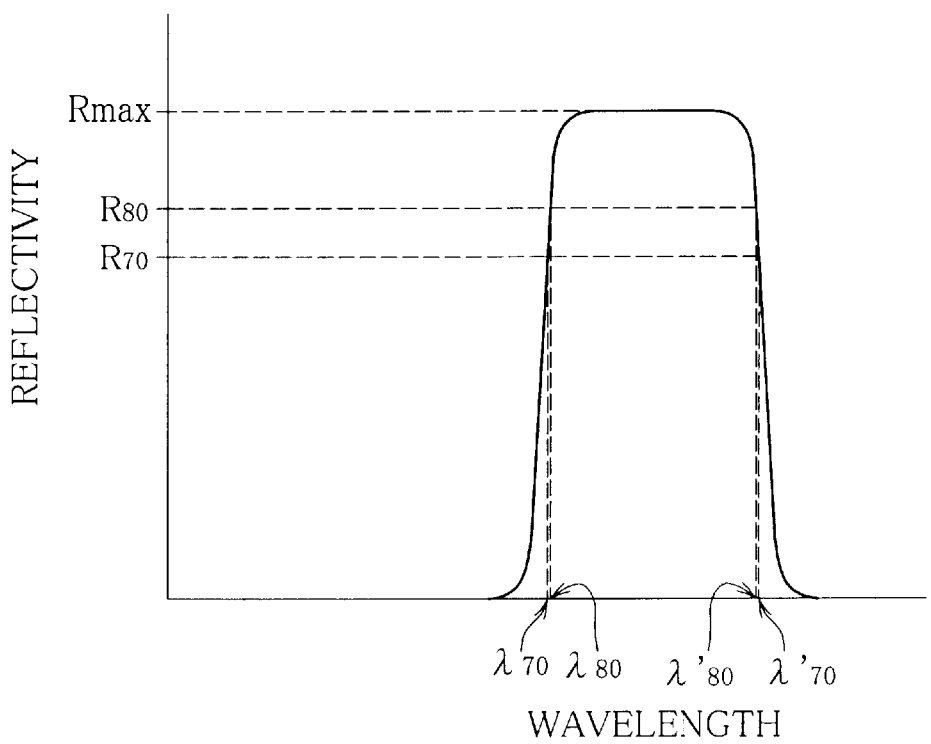
FIG. 4 is an explanatory view for explaining the shape of the reflection spectrum.

It is assumed that the reflection spectrum drawn now has such a shape as shown in FIG. 4.

Here, first, wavelengths $(\lambda_{80}, \lambda'_{80})$ when reflectivity $(R_{80})$ corresponding to 80% of the peak reflectivity (Rmax) in this reflection spectrum, is shown, are obtained to calculate the wavelength region: $(\lambda'_{80}-\lambda_{80})$. At the same time, wavelengths $(\lambda_{70}, \lambda'_{70})$ when reflectivity $(R_{70})$ corresponding to 70% of the peak reflectivity (Rmax) is shown, are obtained to calculate the wavelength region: $(\lambda'_{70}-\lambda_{70})$.

Then, according to the present invention, it is preferred that the reflection spectrum in a state where the value of $(\lambda'_{80}-\lambda_{80})$ is 0.85 times or more the value of $(\lambda'_{70}-\lambda_{70})$.

Since the shape of the reflection spectrum in this state is substantially rectangular as shown in FIG. 4, the light within a wide wavelength band can be returned at the chirped grating. Thus, the threshold values of a carrier density are decreased in a wide wavelength band in a laser device. Therefore, it is useful for realizing multi-modes of the oscillation laser beam from the laser device.

Figure 5:
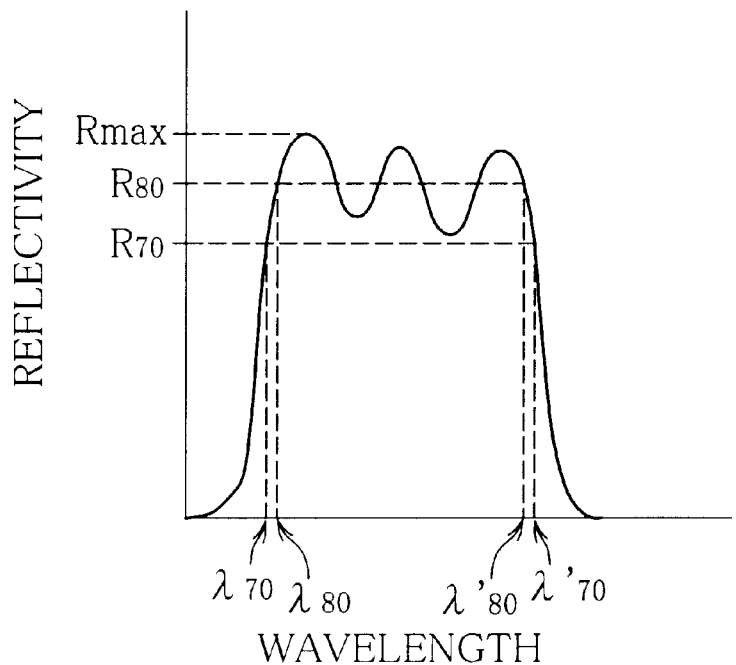
FIG. 5 is a view of a reflection spectrum with another shape.

Note that the reflection spectrum may have such a shape as shown in FIG. 5 depending on the conditions of a phase mask used for forming the grating or the profile of a laser beam for writing the grating. That is, the spectra have a shape in which a plurality of projected and recessed portions are present on the top portion in the reflection spectrum.

However, even though a chirped grating (light feedback portion) is one, which exhibits such reflection spectrum, if the value of $(\lambda'_{80}-\lambda_{80})$ is 0.85 times the value of $(\lambda'_{70}-\lambda_{70})$, the optical output from an exciting laser beam from the laser module is stabilized.

Further, it is preferable that the wavelength region shown by the above-mentioned value of $(\lambda'_{80}-\lambda_{80})$ is three times or more the gap of a longitudinal mode in the oscillation laser beam from the laser device. In this case, at least three longitudinal modes are included in the oscillation bandwidth: $(\lambda'_{80}-\lambda_{80})$ value, and thus, the optical output of the obtained exciting laser beam is stabilized.

In the chirped grating (light feedback portion) $A_1$ formed in the above-described laser module, when the reflectivity is too small, the energy of a reflection laser beam, which returns to the laser device, becomes small. Accordingly, when the oscillation wavelength of laser device itself is apart from the wavelength of the light feedback portion, a problem occurs that the wavelength of the laser device cannot be fixed to the wavelength of the light feedback portion. On the contrary, when the reflectivity is too large, a problem of reduction in the optical output from an end of the optical fiber due to the reflection in the light feedback portion, occurs. Therefore, the reflectivity of the chirped grating is preferably 1 to 20%, and more preferably 2 to 10%.

Further, when the reflection bandwidth of this chirped grating (light feedback portion) $A_1$ is too narrow, it becomes difficult to lower the threshold value of a carrier density in a sufficiently wide wavelength band and a problem occurs that an ideal multi-mode oscillation cannot be obtained. On the contrary, when the reflection bandwidth is too wide, such a problem occurs that the variation in the oscillation wavelength due to applied current becomes large. Therefore, the reflection bandwidth is preferably 0.1 to 4 nm, and more preferably 0.2 to 1 nm.

The reflection bandwidth of the above-mentioned values is preferable when a severe setting of a wavelength is required. Generally, the oscillation wavelength of the laser device are varied by the supplied current and the temperature of the associated laser device. And when the laser device and the light feedback portion are combined, the oscillation wavelength of the laser beam emitted from the laser device in wavelength of the reflection laser beam from the light feedback portion is fixed and the above-mentioned variation in the wavelength can be suppressed.

In the present embodiment as shown in FIG. 1, a Pertier module is disposed within a laser module, and the temperature of the laser device is controlled at a fixed level. Thus, even though the external temperature of the laser module changes, the temperature of the laser device does not change, whereby the wavelength variation of the laser beam from a laser device itself can be suppressed. Then, the laser module can be oscillated at wavelength of the reflection laser beam from the light feedback portion irrespective of the change in the external temperature.

However, the Pertier module is comparatively expensive. Thus, when an inexpensive laser module is manufactured, disadvantages may occur.

Accordingly, a construction in which the thermo-module is not employed is practically important. In that case, when a light feedback portion with a wide reflection bandwidth and a laser device are combined as in the present embodiment, even though the oscillation wavelength of the laser beam from the laser device and the wavelength of the reflection laser beam from the light feedback portion are apart from each other, the laser module preferably tend to oscillate at the wavelength of a reflection laser beam from the light feedback portion.

It is noted that when the thermo-module is not used, the variation in oscillation wavelength of the laser module when the supplied current to the laser device and the external temperature were changed becomes large compared with the case where the thermo-module is used.

However, when a large amplification ratio is not required in an amplifier, the above-described laser module does not require strict setting of the wavelength. Thus, the laser module can function as an inexpensive laser module having appropriate accuracy of wavelength without the thermo-module.

Although a grating having fixed grating pitches, so called a uniform grating is usually used as a light feedback portion, a chirped grating in which for example the grating pitches are changed as in the case of the present embodiment can be used. Then, when such a light feedback portion that the spectra of the reflection beams draw a shape similar to a rectangular shape is formed, the reflection bandwidth can be widened to about 10 to 25 nm.

As explained above, in a case where the strict setting of wavelength is not required, the reflection bandwidth of the light feedback portion is preferably set to 4 to 25 nm.

Figure 6:
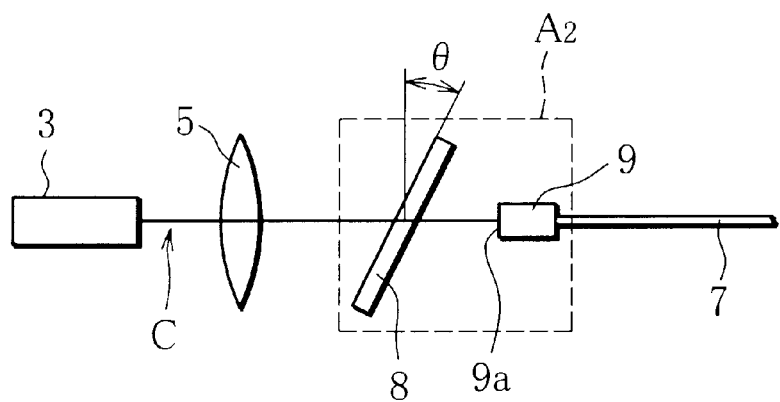
FIG. 6 is a schematic view showing an embodiment of the basic configuration of another laser module according to the present invention.

FIG. 6 shows another laser module of the present invention.

The laser module shown in FIG. 6 is the same as in the laser module in FIG. 2 in that a laser device 3, a lens (light coupling means) 5 and an optical fiber 7 in which their axes are aligned with each other are disposed. However, between the lens (light coupling means) 5 and the optical fiber 7 are disposed a band pass filter 8 in an inclined state by an angle of θ with respect to the optical axis C, and a reflector 9 such as a ferule. A light feedback portion $A_2$ consists of the band pass filter 8 and the reflector 9.

Figure 7:
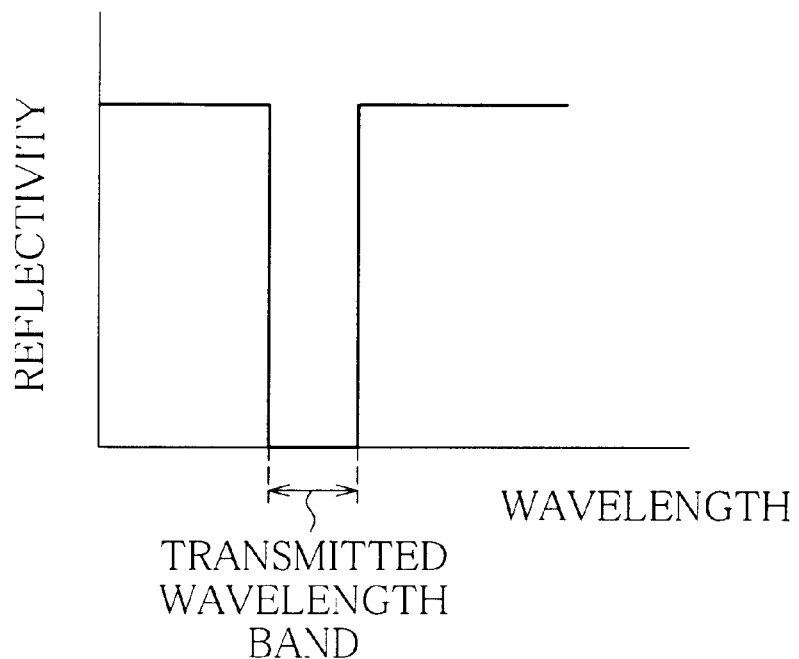
FIG. 7 is a characteristic view showing the reflection properties of a band-pass filter.

Here, the band pass filter 8 transmits only laser beams in a specific band of wavelength, and does not transmit laser beams in other bands of wavelength. Specifically, the laser module in this embodiment has reflection properties shown in FIG. 7. Further, a facet 9a of the reflector 9 provides a flat surface perpendicular to the optical axis C thereby to have reflection properties independent of the wavelength. Thus, this laser module concretely has such reflection properties as shown in FIG. 8.

In the case of this laser module, the oscillation laser beams from the laser device 3 are focused on the lens (light coupling means) 5 and extend to the band pass filter 8. Then, among the oscillation laser beams, only laser beams in the transmission wavelength band shown in FIG. 7 transmit through the band pass filter 8 to allow the laser beams to enter the facet 9a of the reflector 9, and the laser beams in other wavelength bands are diverged to regions outside the system at a reflection angle of θ.

Figure 8:
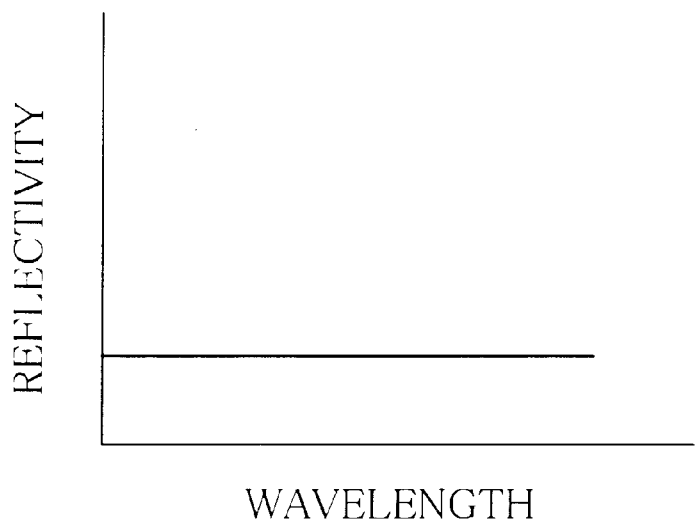
FIG. 8 is a characteristic view showing the reflection properties of a reflector.
Figure 9:
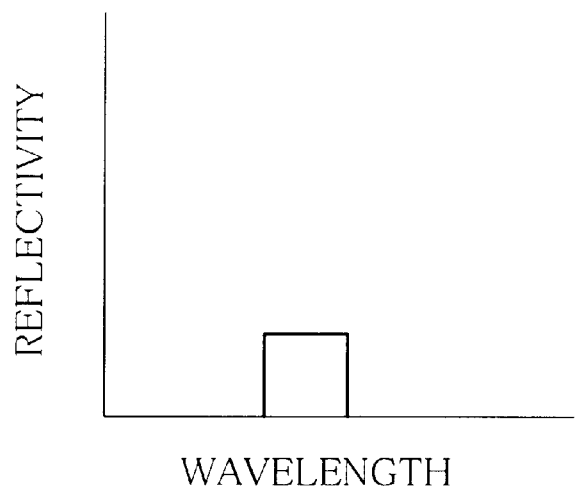
FIG. 9 is a characteristic view showing the reflection properties of reflected light, which feed backs from the reflector in FIG. 6.

Then, although the reflection of the transmitted laser beam occurs at the facet 9a of the reflector 9, the reflection spectrum of the reflection laser beams have a rectangular shape including the transmission wavelength band of the band pass filter 8 and the reflectivity of the reflector 9 shown in FIG. 8, as shown in FIG. 9.

Then, this reflection laser beam returns back to the laser device 3 through the band pass filter 8, and the lens (light coupling means) 5. By repeating this operation, the exciting laser beams are output from this laser module. Thus, in the exciting laser beams the reflection spectrum have a rectangular shape shown in FIG. 9, and are allowed to be in multi-mode and the optical output is stabilized.

Note that in the band pass filter, it is preferred that the transmission ratio in a special wavelength band is 100%, and the transmission ratio in other wavelength band is 0%.

Further, in the laser module shown in FIG. 6, the optical fiber 7 may be directly disposed without disposing the reflector 9. In that case, a facet of the associated optical fiber is used as the reflective surface. The reflectivity in that case may be about 3%.

EXAMPLE

Example 1

1. Manufacturing of Laser Device

Figure 10:
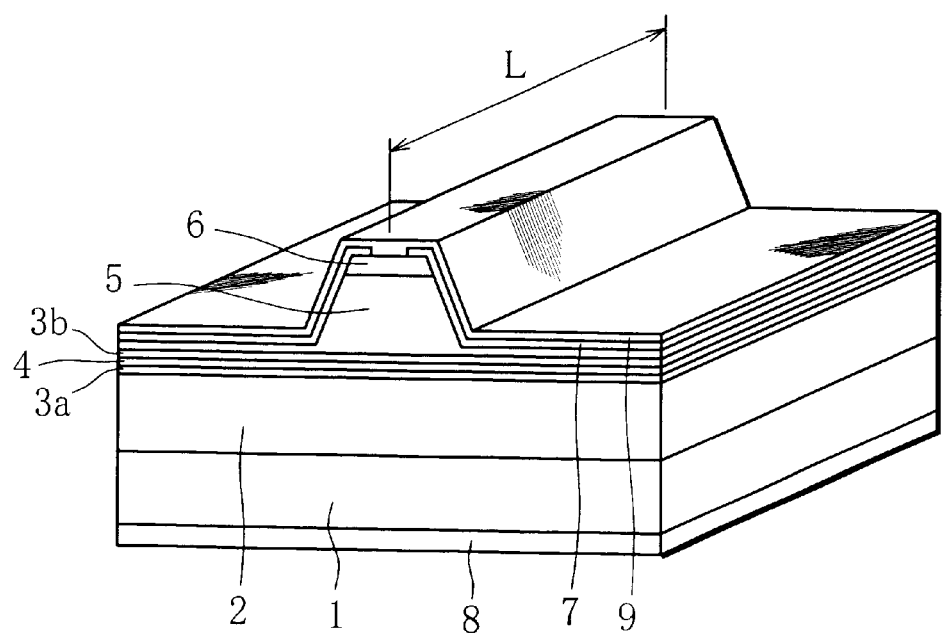
FIG. 10 is a perspective view showing one embodiment of a layer structure of a laser device in the embodiment.

A laser device shown in FIG. 10 was fabricated as follows.

On a substrate 1 of n-GaAs were formed a 4 μm thick lower cladding layer 2 of n-AlGaAs and a 30 nm thick lower GRIN-SCH layer 3a of non-doped AlGaAs, and on the structure were further stacked a two-layered active layer 4 comprised of a 10 nm thick barrier layer consisting of non-doped GaAsP, and a 7 nm thick quantum well layer consisting of non-doped InGaAs, a 30 nm thick upper GRIN-SCH layer 3b of non-doped AlGaAs, a 2 μm thick upper cladding layer 5 of p-AlGaAs, and a 0.5 μm cap layer 6 of p-GaAs in this order.

On the top surface of the layered structure thus formed, a ridge waveguide having 4 μm in width and 1.2 μm in height was formed by the application of the photolithography technique and the etching technique, and on the obtained structure a protecting film 7 of SiN was formed.

Subsequently, the back of the substrate was polished and a lower electrode 8 consisting of AuGeNi/Au was formed on the polished back, and after a part of the protecting film 7 on the cap layer was removed, an upper electrode 9 consisting of Ti/Pt/Au was formed over the entire surface of the layered structure.

Then, after the structure thus formed was cleaved to form a bar having a cavity length (L) of 1200 μm, a lower reflective film of SiN having reflectivity of 2% was formed on a facet of the bar to prepare a front facet and a higher reflective film of $SiO_2$/Si having reflectivity of 92% was formed on the other end thereof to prepare the rear facet. Finally, this bar was machined to manufacture a laser device as a chip.

2. Assembly of Laser Module

As light feedback portions of Example and Comparative Example, a chirped grating and a uniform grating were respectively prepared. These reflecting properties are as follows:

The chirped grating (Example): peak reflectivity (Rmax) 7%, a full width at half maximum 1.5 nm, and the central wavelength 980 nm.

$$\lambda'_{80}-\lambda_{80}=1.22 \text{ nm},\ \lambda'_{70}-\lambda_{70}=1.34 \text{ nm}$$

Therefore, $$(\lambda'_{80}-\lambda_{80})/(\lambda'_{70}-\lambda_{70})\approx 0.9$$

The uniform grating (Comparative Example): peak reflectivity (Rmax) 7%, a full width at half maximum 1.5 nm, and the central wavelength 980 nm.

$$\lambda'_{80}-\lambda_{80}=0.885 \text{ nm},\ \lambda'_{70}-\lambda_{70}=1.125 \text{ nm}$$

Therefore, $$(\lambda'_{80}-\lambda_{80})/(\lambda'_{70}-\lambda_{70})\approx 0.8$$

Using these gratings, the laser modules shown in FIG. 2 were assembled.

3. Exciting Laser Beam from Laser Module

In the laser modules of Example and Comparative Example, current of 100 mA was supplied to the laser devices to oscillate laser beams of a wavelength of 980 nm. Then the variations of the exciting laser beams obtained from the optical fiber 7 were measured. The results are shown in FIG. 11.

Figure 11:
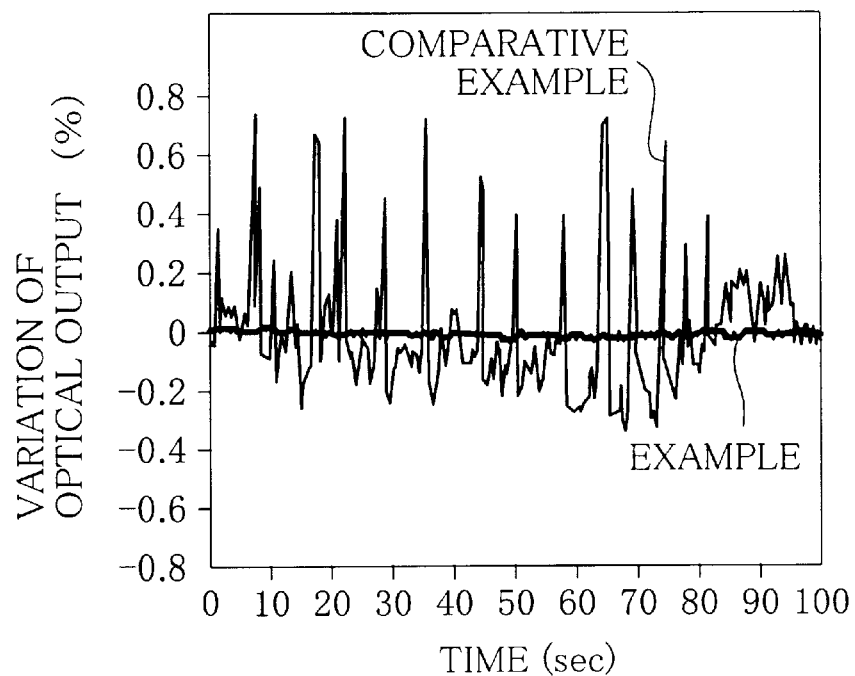
FIG. 11 is a graph showing the variation of optical output of an exciting laser beam from a laser module.

As apparent from FIG. 11, when the laser module of Example is used, the optical outputs of the exciting laser beams are within ±0.1%, which are not almost changed. On the contrary, when the laser module of Comparative Example is used, the optical outputs are significantly changed.

Example 2

Using a semiconductor laser device having properties of cavity length: 1200 nm, gap of longitudinal mode: about 0.11 nm, a laser module in which the components other than the light feedback is the same as those of Example 1 was assembled.

As the light feedback portion, two types of chirped gratings having the following reflecting properties and different reflection bandwidths were used.

Light feedback portion a: the central wavelength 979.8 nm, peak reflectivity 7%, a full width at half maximum 1.5 nm.

$$(\lambda'_{80}-\lambda_{80})/(\lambda'_{70}-\lambda_{70})\approx 0.9$$

Light feedback portion b: the central wavelength 979.1 nm, peak reflectivity 7%, a full width at half maximum 0.9 nm.

$$(\lambda'_{80}-\lambda_{80})/(\lambda'_{70}-\lambda_{70})\approx 0.9$$

With these two laser modules it was checked how the peak wavelength in the oscillation spectrum is changed by the reflection bandwidth of the light feedback portion.

That is, the oscillation spectrum of a laser beam output from the optical fiber is observed with optical spectrum analyzer, and the peak wavelength of the oscillation spectrum was measured while changing the current supplied to the laser device. The results are shown in FIG. 12.

Figure 12:
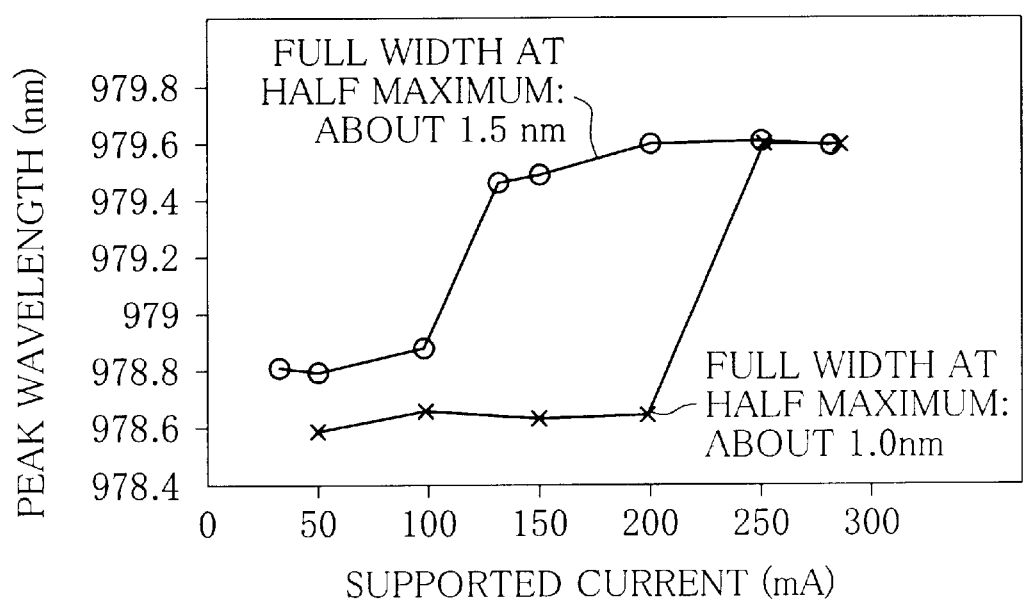
FIG. 12 is a graph showing a relationship between the supplied current and the peak wavelength in an oscillation spectrum.

As is apparent from FIG. 12, the laser module using the light feedback portion b having a smaller reflection bandwidth has a smaller change in the peak wavelength due to the supplied current. Thus, as the light feedback portion, the one having a smaller reflection bandwidth has a smaller change in the peak wavelength with respect to the supplied current for a laser beam from the laser module, and preferably the dependency of the peak wavelength on current becomes smaller.

Generally, in an exciting light source oscillating in a wavelength region of 980 nm the accuracy of wavelength of ±0.5 nm to ±1.0 nm is required for the set wavelength. Therefore, taking the variation of wavelength due to the change of environmental temperature and the variations of wavelength of reflection laser beams at the light feedback portion into consideration, it becomes preferable that the variation of wavelength due to supplied current is within about 0.8 nm.

As explained above, in the chirped grating used in the laser module according to the present invention, it is clearly useful to set the reflection bandwidth to 0.1 to 4 nm, preferably 0.2 to 1 nm.

What is claimed is:

1. A semiconductor laser module comprising: a semiconductor laser device, an optical fiber, light-coupling means, which causes a laser beam emitted from the said semiconductor laser device to enter said optical fiber, and a light-feedback portion, which reflects a laser beam of a specific wavelength,
wherein the shape of a reflection spectrum at said light-feedback portion is substantially rectangular.

2. The semiconductor laser module according to claim 1, wherein the reflection bandwidth of said reflection spectrum, which exhibits reflectivity of 80% with respect to the peak reflectivity, is a value of 0.85 times or more the reflection bandwidth of said reflection spectrum, which exhibits reflectivity of about 70% with respect to the peak reflectivity.

3. The semiconductor laser module according to claim 1, wherein the wavelengths of laser beams emitted from said semiconductor laser device are in a range of 940 to 1100 nm.

4. The semiconductor laser module according to claim 1, wherein the wavelength region of said reflection spectrum, which exhibits reflectivity of about 80% with respect to the peak reflectivity, is a value of three times or more the gap of a longitudinal mode of a laser beam emitted from said semiconductor laser device.

5. The semiconductor laser module according to claim 1, wherein said light feedback portion is a chirped grating formed in said optical fiber.

6. The semiconductor laser module according to claim 1, wherein said light feedback portion comprises a band pass filter slantingly disposed with respect to the optical axis, which transmits only a laser beam of a specific wavelength, and a reflector placed on the emitting side of said band pass filter, which has a reflecting property independent on a wavelength.

7. The semiconductor laser module according to claim 6, wherein said reflector is a facet of said optical fiber on which a laser beam is incident.

8. A semiconductor laser module comprising: a semiconductor laser device, an optical fiber, light-coupling means, which causes a laser beam emitted from the said semiconductor laser device to enter said optical fiber, and a light-feedback portion, which reflects a laser beam of a specific wavelength,
wherein the shape of a reflection spectrum at said light-feedback portion is one in which the top portion has projected and recessed portions.

9. The semiconductor laser module according to claim 8, wherein the reflection bandwidth of said reflection spectrum, which exhibits reflectivity of about 80% with respect to the peak reflectivity, is a value of 0.85 times or more the reflection bandwidth of said reflection spectrum, which exhibits reflectivity of about 70% with respect to the peak reflectivity.

10. The semiconductor laser module according to claim 8, wherein the wavelengths of laser beams emitted from said semiconductor laser device are in a range of 940 to 1100 nm.

11. The semiconductor laser module according to claim 8, wherein the wavelength region of said reflection spectrum, which exhibits reflectivity of about 80% with respect to the peak reflectivity, is a value of three times or more the gap of a longitudinal mode of a laser beam emitted from said semiconductor laser device.

12. The semiconductor laser module according to claim 8, wherein said light feedback portion is a chirped grating formed in said optical fiber.

13. The semiconductor laser module according to claim 8, wherein said light feedback portion comprises a band pass filter slantingly disposed with respect to the optical axis, which transmits only a laser beam of a specific wavelength, and a reflector placed on the emitting side of said band pass filter, which has a reflecting property independent on a wavelength.

14. The semiconductor laser module according to claim 8, wherein said reflector is a facet of said optical fiber on which a laser beam is incident.

* * * * *